(12) United States Patent  (10) Patent No.: US 6,554,142 B2
Gray  (45) Date of Patent: Apr. 29, 2003

(54) VARIABLE MOUNT RACK SYSTEM ARM ASSEMBLY

(75) Inventor: Randolph D. Gray, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 4 days.

(21) Appl. No.: 09/917,375

(22) Filed: Jul. 27, 2001

(65) Prior Publication Data

US 2003/0019824 A1 Jan. 30, 2003

(51) Int. Cl.$^7$ .................................................. A47F 5/00
(52) U.S. Cl. ...................... 211/26; 211/175; 211/190; 312/265.4
(58) Field of Search .................. 211/26, 175, 189, 211/190, 191; 312/223.2, 265.1, 265.2, 265.3, 265.4, 265.5, 265.6; 361/683, 829, 726

(56) References Cited

U.S. PATENT DOCUMENTS

| | | | |
|---|---|---|---|
| 3,133,768 A | 5/1964 | Klakovich | 308/3.6 |
| 3,680,711 A | 8/1972 | Brucker | 211/105.3 |
| 3,697,034 A | 10/1972 | Shell | 248/243 |
| 4,184,726 A | 1/1980 | Cox | 312/320 |
| 4,406,374 A | 9/1983 | Yedor | 211/192 |
| 4,931,907 A | 6/1990 | Robinson et al. | 361/391 |
| 5,460,441 A | 10/1995 | Hastings et al. | 312/298 |
| 5,505,533 A | 4/1996 | Kammersqard et al. | 312/236 |
| 5,546,277 A | 8/1996 | Zandbergen | 361/726 |
| 5,571,256 A | 11/1996 | Good et al. | 211/26 |
| 5,791,498 A | 8/1998 | Mills | 211/26 |
| 5,833,337 A | 11/1998 | Kofstad | 312/334.5 |
| 5,850,925 A | 12/1998 | Gandre | 211/26 |
| 5,941,621 A | 8/1999 | Boulay et al. | 312/334.4 |
| 6,011,701 A | 1/2000 | Kopp et al. | 361/818 |
| 6,021,047 A | 2/2000 | Lopez et al. | 361/727 |
| 6,021,909 A | 2/2000 | Tang et al. | 211/183 |
| 6,070,742 A | 6/2000 | McAnally et al. | 211/26 |
| 6,070,841 A | 6/2000 | Robinson | 248/220.43 |
| 6,070,957 A | 6/2000 | Zachrai | 312/334.4 |
| 6,095,345 A | 8/2000 | Gibbons | 211/26 |
| 6,142,590 A | 11/2000 | Harwell | 312/223.1 |
| 6,181,549 B1 | 1/2001 | Mills et al. | 361/683 |
| 6,185,092 B1 | 2/2001 | Landrum et al. | 361/683 |
| 6,223,908 B1 | 5/2001 | Kurtsman | 211/26 |
| 6,230,903 B1 | 5/2001 | Abbott | 211/26 |
| 6,273,534 B1 | 8/2001 | Bueley et al. | 312/334.8 |
| 6,422,399 B1 * | 7/2002 | Castillo et al. | 211/26 |
| 6,431,668 B1 * | 8/2002 | Reddicliffe | |
| 6,435,354 B1 * | 8/2002 | Gray et al. | 211/26 |

OTHER PUBLICATIONS

U.S. pending patent Appl. Ser. No. 08/881,289 entitled "Chassis Retaining System for an Electronics Rack" by Mills et al., assigned to Dell USA L.P. (Client No. DC–01275), filed Jun. 24, 1997.

(List continued on next page.)

Primary Examiner—Robert W. Gibson, Jr.
(74) Attorney, Agent, or Firm—Baker Botts L.L.P.

(57) ABSTRACT

In one aspect of the present disclosure, a rack system includes a pair of arm assemblies that include an arm with reversible brackets on either end of each arm. The arm assemblies attach to the rack rails and support a component such as a server. The brackets are formed to selectively rotate with respect to the arm between a first position and a second position. In the first position the brackets are operable to interface a rack system rails that have a first interface type. In the second position the brackets are operable to interface rack system rails that have a second interface type. This allows the arm assembly to be installed in different types of rack systems.

18 Claims, 4 Drawing Sheets

OTHER PUBLICATIONS

U.S. pending patent Appl. Ser. No. 09/470,280 entitled "*Connector Arrangement and Connecting Method for Cable Management Arms*", assigned to Dell USA L.P. (Client No. DC–02095), filed Dec. 22, 1999.

U.S. pending patent Appl. Ser. No. 09/489,409 entitled "*Apparatus for Providing Displacement to A Slide Mounted Chassis in a Rack*" by Johnson, assigned to Dell USA L.P. (Atty's Dkt 016295.0545 (DC–02146), filed Jan. 21, 2000.

U.S. pending patent Appl. Ser. No. 09/518,841 entitled "*Rack Mount Slide System Enabling Front, Top and Rear Access to a Rack Mounted Device*" by Baddour et al., assigned to Dell Products L.P. (Atty's Dkt 016295.0571 DC–02172), filed Mar. 3, 2000.

U.S. pending patent Appl. Ser. No. 09/718,201 entitled "*Rack System and Method having Tool–less Releasable Arm Assembly,*" by Castillo, et al., assigned to Dell Products L.P. (Atty's Dkt 016295.0599 DC–02304), filed Nov. 11, 2000.

U.S. pending patent Appl. Ser. No. (Unknown) entitled "*Mounting Rail for Hard Disk Drive*" by Curlee et al., assigned to Dell Products L.P. (Client No. DC–02513), filed Jul. 10, 2001.

Product Brochure, Jonathan Engineered Solutions, 2000.

* cited by examiner

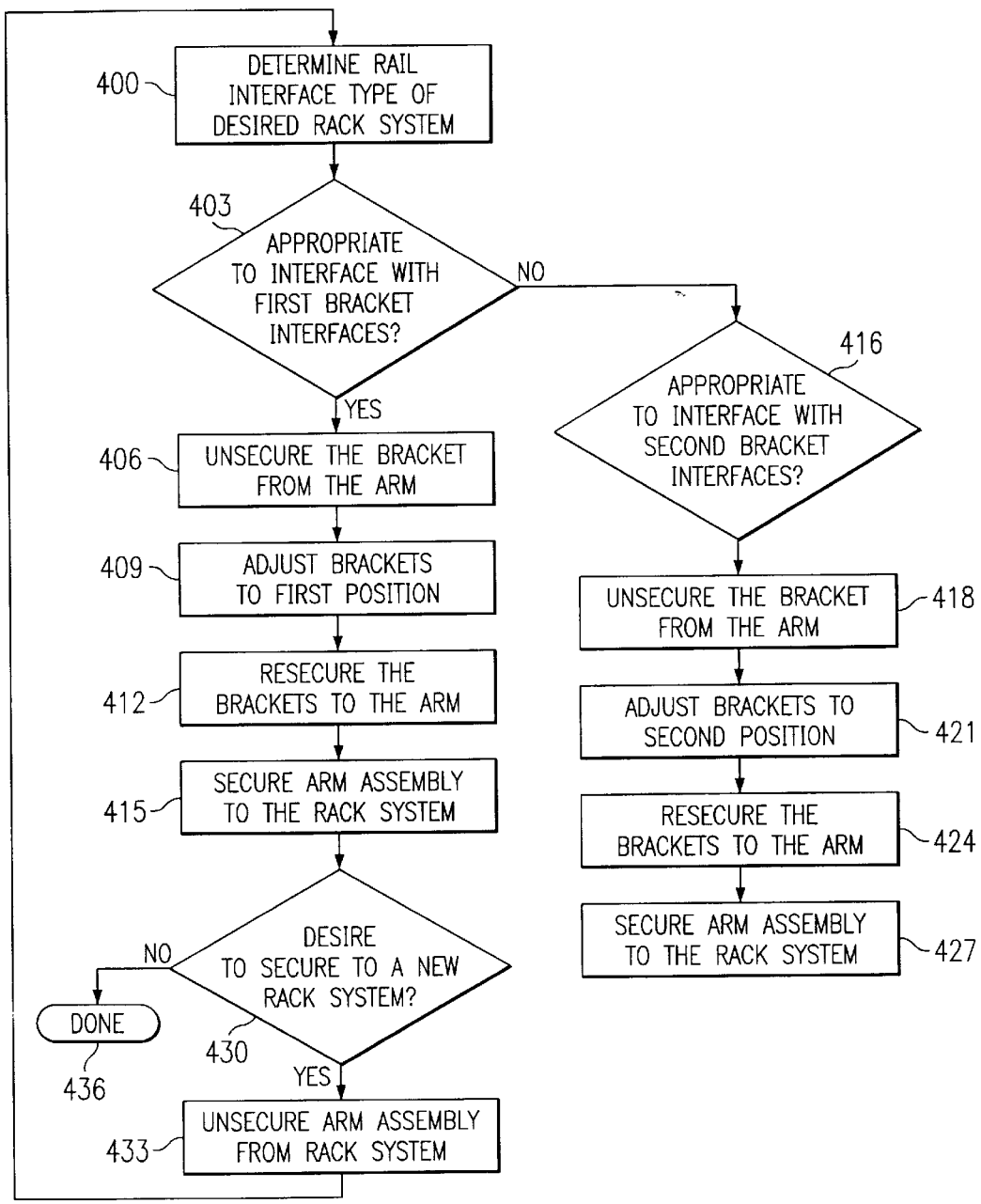

VARIABLE MOUNT RACK SYSTEM ARM ASSEMBLY

RELATED APPLICATIONS

This application is related to application Ser. No. 09/718,201 filed Nov. 21, 2000 entitled Rack System and Method Having Tool-less Releasable Arm Assembly filed by Henry Castillo et al., now U.S. Pat. No. 6,422,399.

TECHNICAL FIELD

This disclosure relates to the field of electronics and more specifically relates to a rack system and method having a variable mount arm assembly.

BACKGROUND

Electronic devices such as computer components are often stored in an electronic rack system, sometimes referred to as a rack system or rack, to conserve floor space. A variety of different computer components including servers, computers, storage devices such as disk drives, tape drives, RAID drives, keyboards, monitors, switch boxes, and communications components, as well as other electrical devices can be housed in rack systems. Standards such as the Electronics Industry Association (EIA) 310-D or RS-310 rack standards have been developed to standardize the height and width of electronic rack systems to facilitate effective use of the space within rack systems.

The vertical space within a rack system is generally defined in vertical mounting unit increments, often referred to as "U's". A mounting unit or U is typically 1.75 inches. In accordance with industry standards some interior rails of rack systems have three mounting slots spaced within each U of vertical space for attaching components. Rack systems and components are typically sized in mounting unit increments. For example, "2U" components are sized to fit within a 2U vertical space. "48U" and "72U" racks are sized to have 48U and 72U, respectively, of usable vertical space.

Support structures such as arm assemblies are often used to support components within a rack system. The support structures typically attach to mounting slots formed in the interior rails. A common problem is that support structures are typically formed to be mounted within racks with a particular type of rail and mounting slot. Accordingly, support structures are limited in use to the particular type of rack rail for which they are designed. If, for example, a support structure designed to mount to a rack system with a rectangular slot in accordance with EIA-310-D is no longer in use, it cannot be easily reused in a rack with rails having a rounded or tapped hole interface according to EIA-310-D. Obtaining a proper type of arm assembly with a compatible interface or an adapter to can be time consuming. Further, because the arm assembly cannot be revised until a use for the arm assembly is found and may require storage of assemblies not being used.

These difficulties discourage the efficient reuse and transferal of rack support structures. As a result, a change of rack type or a rearrangement of components is discouraged or often requires the acquisition of rack-specific support structures.

SUMMARY

Therefore, a need has arisen for a rack system support structure that is easily transferable between rack systems of different types.

A further need has arisen for a rack system arm assembly that may attach to rack systems with rails having either a generally round interface or a generally rectangular interface.

A further need has arisen for a rack system arm assembly that is easily adapted to support components in different rack systems.

In accordance with teachings of the present disclosure, a system and method are described for a variable mount arm assembly for installing support structures within different types of rack systems for supporting components.

More specifically, the first position of each bracket may align a first bracket interface with the first rail interface. The second position allows a second bracket interface to align with a second rail interface. The first bracket interface may include two hooks formed to interface with a rectangular hole-type rail interface and may also include a latch assembly to provide a tool-lessly attachment to the rail interface. The second bracket may include at least one aperture formed to interface with a generally round hole-type rail interface.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 4 is a flow chart describing one embodiment of a method for installing arm assemblies according to the present invention.

DETAILED DESCRIPTION

Preferred embodiments and their advantages are best understood by reference to FIGS. 1 through 4, wherein like numbers are used to indicate like and corresponding parts.

Figure 1A:
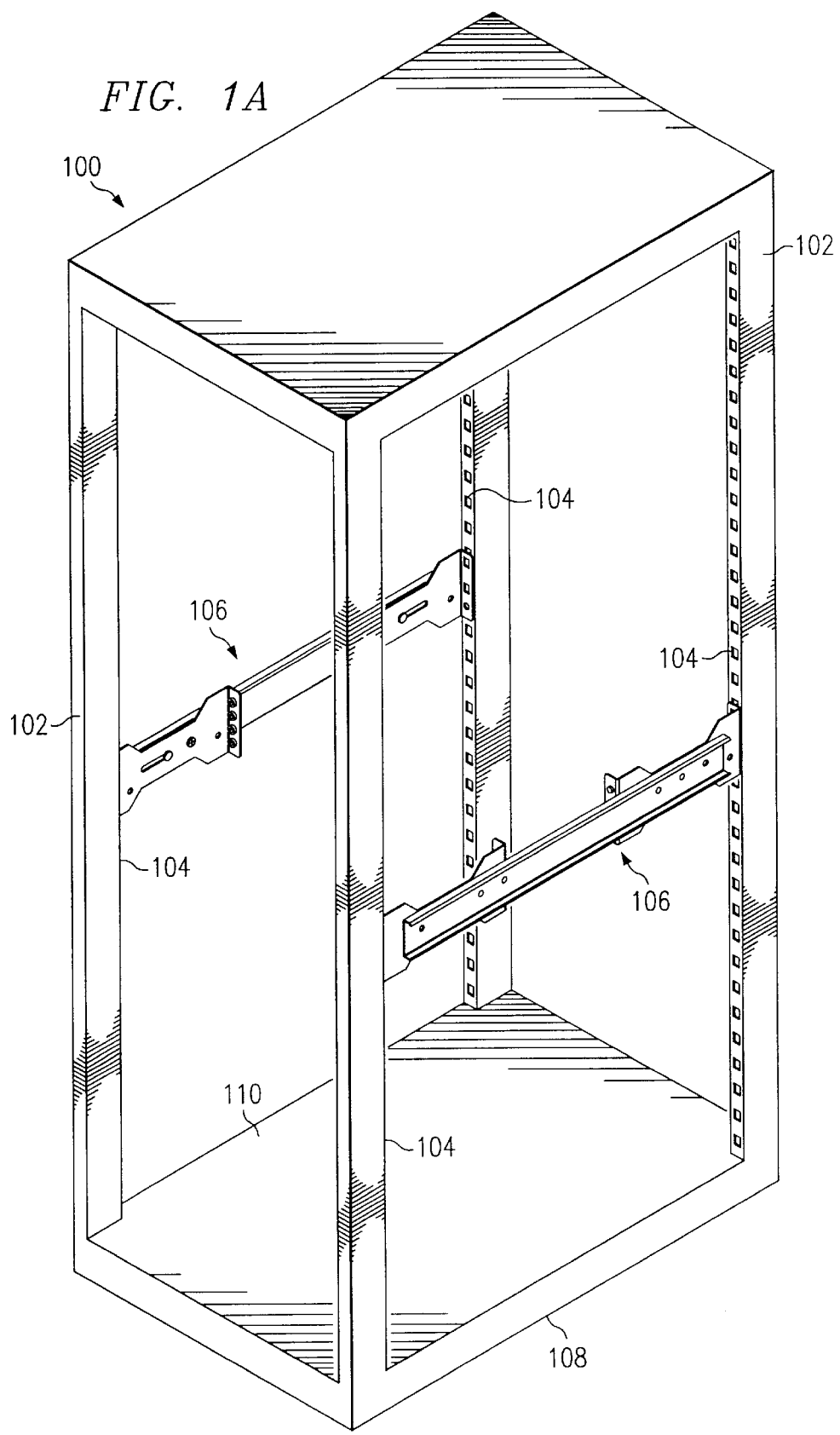
FIG. 1A shows a schematic diagram of one embodiment of a rack system having rails with arm assemblies according to the present disclosure.

Referring to FIG. 1A, a schematic diagram of one embodiment of a rack system according to the present disclosure is shown. Rack system 100 includes a plurality of rails 102. Rails 102 are generally aligned along first side 108 and second side 110 of rack 100. Each rail 102 preferably includes standard rail interface 104, which may include a plurality of apertures or mounting slots. In certain embodiments, standard rail interface 104 may comply with a rack standard such as the EIA RS 310 standard or with a rack standard such as the EIA 310-D.

The present embodiment further includes arm assemblies 106. Arm assemblies 106 attach to the standard rail interface portions 104 of rack 100 and are further operable to support components stored in rack 100.

such as servers, disk drives, tape drivers, raid drives, monitors, keyboards, routers or other suitable equipment.

Arm assemblies 106 may include slide assemblies (not expressly shown) for supporting components that are movable between an extended position and a retracted position. Slide assemblies may be easily employed to support a component. A component secured to slide assembly may be accessed for installation, removal, maintenance or repair while extended from the rack and later stored within the rack with slide assembly in the retracted position.

Figure 1B:
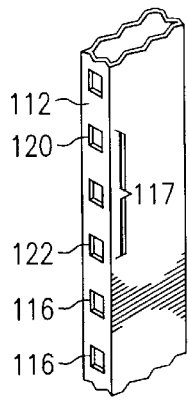
FIGS. 1B and 1C are schematic diagrams showing a segment of a rack system rail interface having a rectangular hole-type interface and a rounded hole-type interface, respectively.

Referring now to FIG. 1B, a preferred embodiments of a first rail interface 112 is depicted. First rail interface 112 includes generally rectangular holes 116 arranged into defined standard mounting units, or "U's" 117. In one particular embodiment rectangular holes 116 are in accordance with EIA standard EIA-310-D. Each standard mounting unit is typically made up of three holes spaced in accordance with an industry standard such as EIA standard EIA-310-D.

Figure 1C:
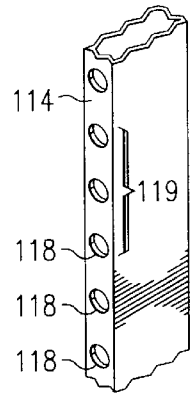

FIG. 1C depicts second rail interface 114. Second rail interface 114 includes generally rounded-type holes 118 arranged into mounting units, or U's 119. In one embodiment rounded holes 118 are formed in accordance with EIA standard EIA-310-D. Further round holes 118 may include tapped holes to facilitate the attachment of arm assemblies 106 to rails 102 industry standard such as EIA standard EIA-310-D. Alternative embodiments may include additional standard rail interface types.

Figures 2A, 2B:
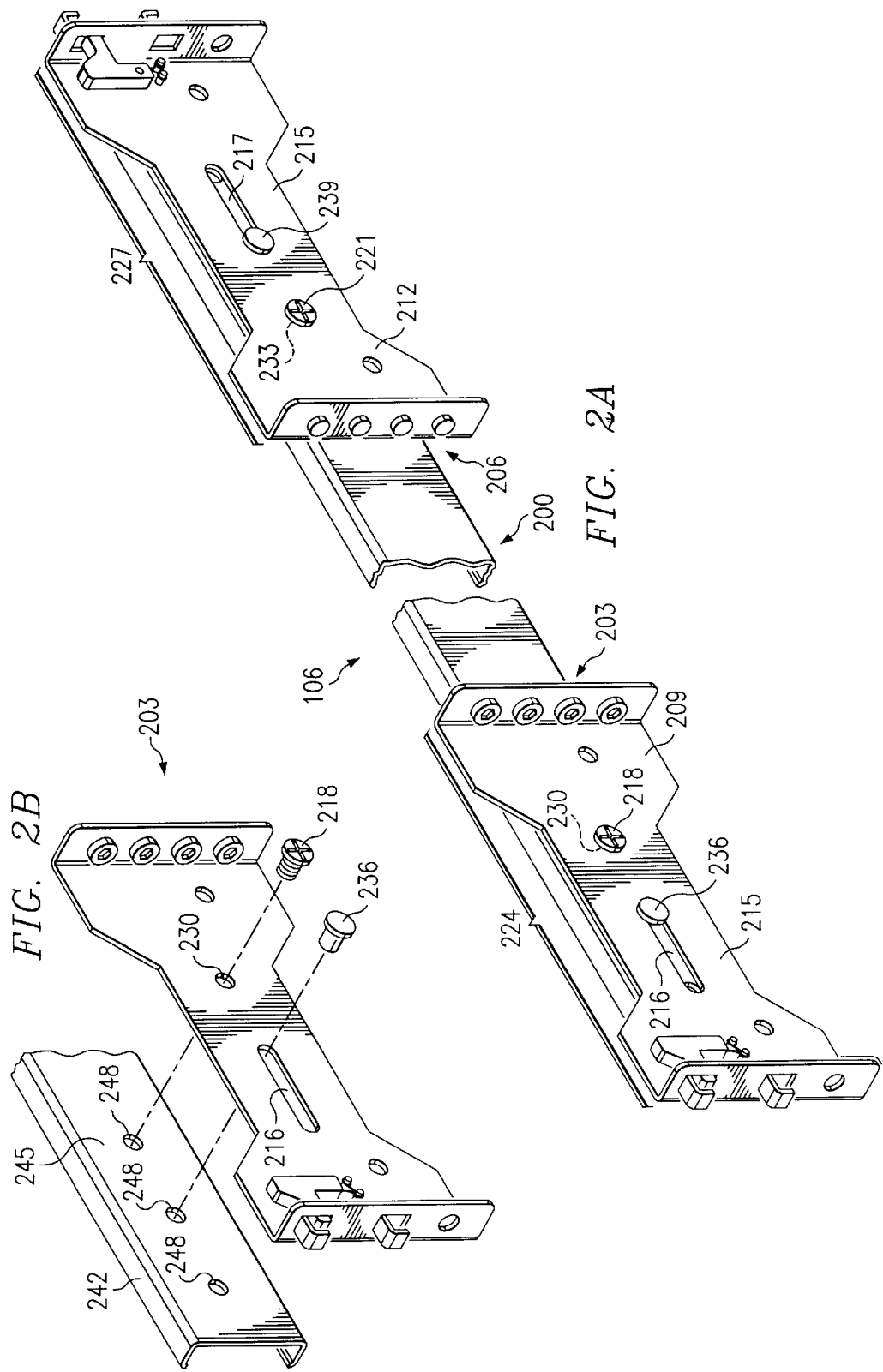
FIG. 2A is a schematic of one embodiment of an arm assembly having a variable mount bracket according to the present disclosure.
FIG. 2B is an exploded view of a portion of an arm assembly with a variable mount bracket according to the present disclosure.

FIG. 2A is a schematic diagram of one embodiment of an arm assembly according to the present disclosure. In the present embodiment, arm assembly 106 includes an arm 200 having first end 203 and second end 206. First bracket 209 preferably couples to first end 203; second bracket 212 preferably couples to second end 206. Brackets 209 and 212 are formed to be selectively rotated about central pivots 216 and 217 respectively to enable the brackets 209 and 212 to interface with rack systems of various types.

In the present embodiment first bracket 209 includes first bracket body 224 with mounting apertures 230 and second bracket 212 includes second bracket body 227 and mounting apertures 235. First bracket 209 preferably couples to arm 207 using fasteners 221. Fasteners 218 and 221 may include loose threaded fasteners such as threaded screws and bolts. Fasteners may include a thumbscrew or another suitable fastener that does not require a tool for installation.

In an alternative embodiment, bracket 209 and 212 may attach to arm 200 using a plurality of apertures of any suitable size and shape. Further, any suitable fastener may be used selectively to attach brackets 209 and 212 to arm 200.

In the present embodiment first bracket 209 includes central pivot 216; second bracket 212 includes central pivot 217. Central pivots 216 and 217 are formed to allow central pivot fasteners 236 and 239 to extend there through and aligning with apertures 248 formed in arm 203 (as shown in FIG. 2B), allowing brackets 209 and 212 to rotate. Central pivot fasteners 236 and 239 may be thumbscrews, loose thread fasteners, or suitable fastener that will allow brackets 209 and 212 to rotate about pivots 216 and 217, respectively.

Referring now to FIG. 2B, an exploded view of one embodiment of bracket 209 and arm 207 with portions removed is shown. Central pivot fastener 236 and fastener 218 further may extend through two arm mounting apertures 248. Mounting apertures 248 are formed in both ends 203 and 206 of arm 207. In alternative embodiments, mounting apertures 248 may be threaded to facilitate the use of threaded fasteners. A plurality of mounting apertures 248 may be formed for attaching brackets 209 and 212 to arm 200.

First bracket 209 includes elongated aperture 216. Elongated aperture 233 allows bracket 209 to be laterally adjusted to ease mounting of the arm assembly within a rack system. The second bracket 212 and the second end 206 of the arm 207 may be similarly secured and may include a second set of arm mounting apertures (not expressly shown).

In the present embodiment, bracket 209 includes latch assembly 242. Latch assembly 242 is preferably operable to releaseably secure bracket 209 to a rail interface within a rack system (such as rack interface 104 shown in FIG. 1). Preferably, latch assembly 242 allows bracket 209 to toollessly attach to a rail interface. In an alternative embodiment, any suitable latch assembly may be employed to releaseably secure bracket 209 to a rack rail interface.

In a preferred embodiment, central pivots 216 and 217 may be elongated to allow lateral adjustment of first bracket 209 and second bracket 212, respectively, with respect to arm 200. In such an embodiment, bracket mounting apertures 230 and 233 may also be elongated to facilitate lateral adjustment of brackets 209 and 212 with respect to arms, allowing arm assembly 106 to be mounted in rack systems of various depths. Further, in such an embodiment, first bracket 209 and second bracket 212 may include a stop point or button (not expressly shown) to secure brackets 215 while mounting.

In another alternative embodiment, central pivots 216 and 217 and bracket mounting aperture(s) 230 and 233 may be include an embossed rib for providing an interference fit with arm 200. Such an embossed rib would preferably provide added strength.

Now referring to FIG. 3, a schematic diagram is shown of first bracket 209 mounted to first end of arm 203 within arm assembly 203 with portions of arm assembly 106 cut away. In the present embodiment first bracket body 224 includes first bracket interface 300 extending generally perpendicular to first bracket body 224. Second bracket interface 306 extends generally perpendicular to first bracket body 224 on second bracket end 309.

Figure 3A:
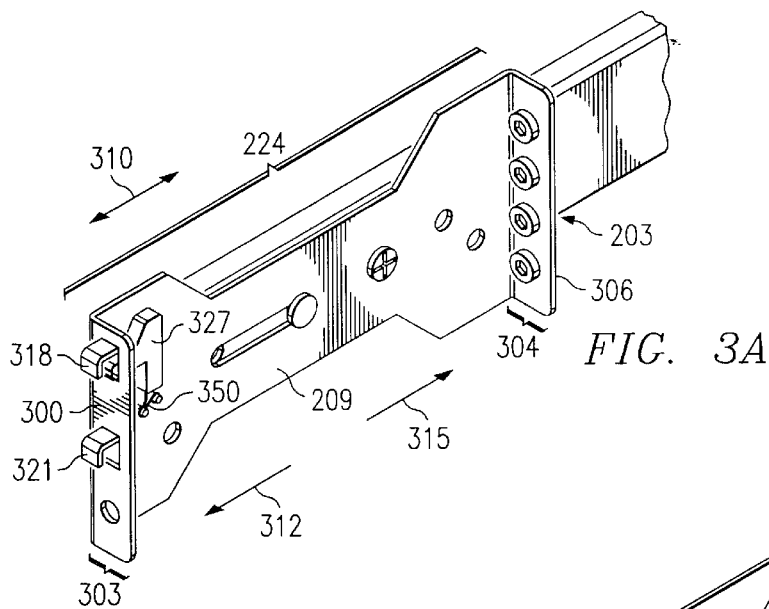
FIG. 3A is a schematic diagram showing one embodiment of a variable mount bracket attached to an arm.
Figure 3B:
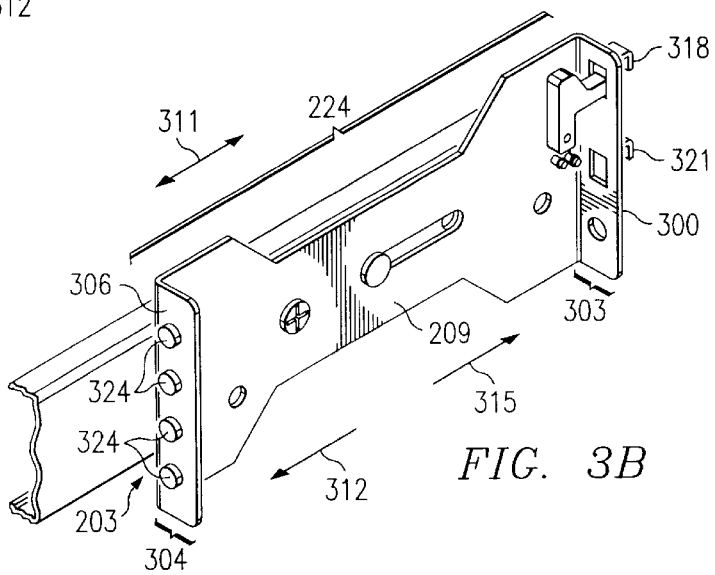
FIG. 3B is a schematic diagram showing one embodiment of a variable mount bracket attached to an arm.

In the present embodiment, first bracket 209 rotates about central pivot 216 between first position 310 (shown in FIG. 3A) and second position 311 (shown in FIG. 3B).

In first position 310, first bracket interface 300 is preferably directed in an outward direction indicated by arrow 312 for attaching to a rack system rail interface. In second position 311, first bracket 224 is preferably rotated such that second bracket interface 306 is preferably directed in an outward direction indicated by arrow 312 for interfacing with a rack system rail interface. While in second position 311, first bracket interface portion is directed inward, as indicated by arrow 315.

In first position 310, first bracket interface 300 is operable to interface with a rack system rail 102 having first rail interface type 112 such as a rectangular slot as shown in FIG. 1B formed in accordance with EIA standard EIA-310-D. In second position 311, second bracket interface 306 is preferably operable to interface with rack system rail 102 having a second rail interface type 114 such as a rounded hole interface as described in EIA standard EIA-310-D and shown in FIG. 1C.

To facilitate the interface with first rail interface type 112, first bracket interface 300 preferably includes first hook 318 and second hook 321 extending from first bracket 209. First hook 318 and second hook 321 preferably have a downward-facing, generally L-shaped configuration. Hooks 318 and 320 are vertically spaced to align with a first aperture 120 and a third aperture 122, respectively, of a mounting unit. For brackets formed to interface with multiple vertical mounting units, first hook 318 may preferably interface with a first or uppermost aperture within a first mounting unit and second hook 321 may preferably interface with a third or lowermost aperture within a mounting unit.

In a preferred embodiment, first bracket interface 300 may preferably include latch assembly 327 with a spring locking mechanism 330 formed to allow the first bracket 209 to be mounted tool-lessly and releasably. In an alternative embodiment, any suitable latch or attachment assembly may be used.

In order to attach to a second type of rail interface 114, second bracket interface 306 includes a plurality of apertures 324, spaced vertically to coincide with the spacing of 118 formed within rack system rail 102. In such an embodiment, first bracket 209 may be secured to multiple types of rack system rails 102 as the one described by the flow chart of FIG. 4. Initially, a determination is made about the type of interface the rails of the desired rack system have 400. This interface may preferably be a round, tapped, or square hole EIA standard mounting interface.

Next, a determination is made about whether the first bracket interface is appropriate to secure to rail interface identified in step 400. If first bracket interface is appropriate, then, assuming the first bracket interface is facing inward with respect to the arm (as shown in FIG. 3B), the brackets may be unsecured from the arm as in 406 by unfastening the fasteners through their respective bracket mounting apertures, and loosening their respective central pivot fasteners 406. Then, the brackets may be selectively positioned in the first position by rotating the brackets about their respective central pivots 409. The brackets are then resecured to the arm 412 by fastening the fasteners through their respective bracket mounting apertures and tightening the respective central pivot fasteners.

In one particular embodiment, the brackets may be adjusted laterally to fit rack systems of various depths or generally to aid in installation. After lateral adjustment, brackets may be resecured to the arm by positioning the fasteners along the length of respective elongated bracket mounting apertures and/or respective central pivots.

The arm assembly may then be secured to the rack system 415. In one embodiment, the rail interfaces can be generally rectangular slot, EIA standard EIA-310-D interface types. In such an embodiment, the first bracket interfaces may include at least two hooks. In a preferred embodiment the first bracket interface of the first bracket may also include a latch assembly. In such an embodiment, the arm assembly may be mounted tool-lessly by aligning the first bracket interface of the first bracket to the interface portion of the rail. The hooks may then be placed such that they rest within the rail interface. In a preferred embodiment, the alignment of the hooks with the rail interface may automatically operate the latch assembly, locking the bracket into place. The second bracket may then be secured by aligning the first interface of the second bracket to the rail interface, and securing the hooks of the first bracket interface to the rail interface.

However, if the rail interface is not appropriate to be interfaced with the first bracket interfaces, as in 403, then, it may be determined whether the second bracket interface of the first bracket is compatible with the desired rack system rail interface 416.

If the second interface is appropriate, similar to the method above, the brackets may be unsecured from the arm as in 421 if they are not in an outward facing position. The brackets may be rotated by unfastening the fasteners through their respective bracket mounting apertures, and loosening their respective central pivot fasteners. Next the brackets may be selectively positioned by rotating them about their respective central pivots 424. The brackets are then preferably resecured to the arm by securing fasteners through their respective bracket mounting apertures and tightening the respective central pivot fasteners 427. In one embodiment, the brackets may be adjusted laterally to fit rack systems of various depths described above using elongated mounting apertures formed on the bracket, the arm, or both.

433 describes a decision as to whether an arm assembly could be transferred to another rack. If it is desired that the arm assembly be transferred, then the arm assembly may be unsecured from the current rack system 436, and the process of installing the arm assembly with a rack is repeated 400.

Although the disclosed embodiments have been described in detail, it should be understood that various changes, substitutions and alterations can be made to the embodiments without departing from their spirit and scope.

What is claimed is:

1. A rack system comprising:
   a rack having a plurality of rails each having a standard interface;
   a first arm assembly comprising:
      an arm having a first end and a second end;
      a first bracket secured to the first end of the arm selectively moveable between a first position and a second position, the first position operable to attach a first bracket interface with a first rail interface, the second bracket position operable to attach a second bracket interface with a second rail interface;
      a second bracket secured to the second end of the arm;
      a component supported by the arm assembly;
      the first bracket interface comprising at least two hooks formed to interface with an interface portion of a rail; and
      the second bracket interface comprising at least two apertures.

2. The rack system of claim 1, further comprising the first bracket formed to selectively rotate around a central pivot formed in the bracket between the first position and the second position.

3. The rack system of claim 1, wherein the first bracket further comprises:
   at least one elongated mounting aperture formed to allow lateral adjustment of the first bracket with respect to the arm.

4. The rack system of claim 1, wherein the arm assembly further comprises a slide assembly coupled to the arm and selectively moveable between an extended position and a retracted position.

5. The rack system of claim 1, wherein the component further comprises a server.

6. The rack system of claim 1, wherein:
   the arm further comprises at least one mounting aperture;
   the first bracket further comprises at least one mounting aperture; and
   at least one fastener extending through the arm mounting aperture and the first bracket mounting aperture.

7. A bracket for a rack system, comprising:
   a bracket operable to attach to a rack support arm and be secured to a rack system rail, the bracket having a first end and a second end;
   the first end forming a first rail interface having at least two hooks formed to interface with an interface portion of a rail; and the second end forming a second rail interface having at least two apertures.

8. The bracket of claim 7, wherein the bracket further comprises:
   the at least two hooks formed to interface with a rail having a square-type hole interface; and
   the plurality of apertures vertically spaced to align with apertures of a rail having a rounded-type interface.

9. The bracket of claim 8, wherein the bracket further comprises:
   the first rail interface formed to interface with a rail having an EIA standard interface; and
   the second rail interface formed to interface with a rail with an EIA standard interface.

10. The bracket of claim 7, further comprising:
    a central pivot formed on the bracket; and
    the bracket rotateable about the central pivot between the first position and the second position.

11. The bracket of claim 7, wherein the bracket further comprises at least one elongated mounting aperture formed to allow the bracket to be secured to an arm and to move laterally with respect to an arm.

12. The bracket of claim 7, wherein the first rail interface further comprises:
    at least two hooks formed to interface with an interface portion of a rail; and
    a moveable latch operable to allow the bracket to be mounted tool-lessly.

13. A method for installing an arm assembly within a rack system comprising:
    securing a first bracket to an arm assembly, the first bracket having a first bracket interface comprising at least two hooks and a second bracket interface comprising at least two apertures, the bracket movable between a first interface position and a second interface position;
    determining a rack system rail interface type for a rack system;
    positioning the first bracket in an interface position appropriate for the determined rack system rail interface type;
    aligning the first bracket with the rack system rail interface; and
    securing the first bracket to the rack system rail interface.

14. The method of claim 13, wherein adjusting the first bracket further comprises
    rotating the first bracket to a first position for aligning the first bracket interface with a rail interface determined to be a square hole interface; and
    rotating the first bracket to a second position for aligning the second bracket interface with a rail interface determined to be a generally rounded interface.

15. The method of claim 14, wherein rotating the first bracket comprises:
    unsecuring the first bracket from the arm;
    rotating the first bracket about a central pivot; and
    securing the first bracket to the arm.

16. The method of claim 13, wherein installing an arm assembly within a rack system further comprises:
    detaching the first bracket from a first rack system having rails that have a first interface type;
    detaching a second bracket secured to a second end of the arm from the first rack system;
    aligning the first bracket with an interface portion of a first rail of a second rack system having a plurality of rails that have a second interface type;
    aligning the second bracket with a second interface portion of a second rail of the second rack system;
    securing the first bracket to the first rail of the second rack system; and
    securing the second bracket to the second rail of the second rack system.

17. The method of claim 13, further comprising toollessly and releasably securing the first bracket to the interface portions of the first rail using a latch associated with the first bracket formed to allow the first bracket to be mounted tool-lessly.

18. The method of claim 13, further comprising:
    partially unsecuring the first bracket from the arm assembly;
    sliding the bracket laterally with respect to the arm;
    assembly to correspond to a selectectd rack system depth; and
    securing the first bracket to the first end of the arm.

* * * * *